United States Patent
Chiang et al.

(10) Patent No.: US 11,183,449 B1
(45) Date of Patent: Nov. 23, 2021

(54) CRYOGENIC INTEGRATED CIRCUITS

(71) Applicant: Taiwan Semiconductor Manufacturing Co., Ltd., Hsinchu (TW)

(72) Inventors: Hung-Li Chiang, Taipei (TW); Chao-Ching Cheng, Hsinchu (TW); Tzu-Chiang Chen, Hsinchu (TW); Jin Cai, Hsinchu (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/881,005

(22) Filed: May 22, 2020

(51) Int. Cl.
| | |
|---|---|
| *H01L 23/50* | (2006.01) |
| *H01L 21/82* | (2006.01) |
| *H01L 23/44* | (2006.01) |
| *H01L 23/367* | (2006.01) |
| *H01L 23/427* | (2006.01) |
| *H01L 23/433* | (2006.01) |

(52) U.S. Cl.
CPC .............. *H01L 23/50* (2013.01); *H01L 21/82* (2013.01); *H01L 23/3675* (2013.01); *H01L 23/427* (2013.01); *H01L 23/445* (2013.01); *H01L 23/433* (2013.01)

(58) Field of Classification Search
None
See application file for complete search history.

(56) References Cited

U.S. PATENT DOCUMENTS

| | | | | |
|---|---|---|---|---|
| 4,774,630 | A * | 9/1988 | Reisman ................. | G02B 6/42 174/16.3 |
| 5,268,812 | A * | 12/1993 | Conte ................. | F28D 15/0233 361/698 |
| 5,880,524 | A * | 3/1999 | Xie ........................ | H01L 23/433 257/704 |
| 5,990,550 | A * | 11/1999 | Umezawa ............. | H01L 23/367 257/697 |
| 6,163,073 | A * | 12/2000 | Patel .................... | F28D 15/0233 257/712 |
| 2007/0187069 | A1 * | 8/2007 | Ueno .................... | H01L 23/427 165/80.3 |
| 2008/0290499 | A1 * | 11/2008 | Nishi ...................... | H01L 24/32 257/712 |
| 2010/0148356 | A1 * | 6/2010 | Tamaki ............... | H01L 25/0657 257/712 |
| 2014/0015106 | A1 * | 1/2014 | Hsieh .................. | H01L 23/3677 257/618 |
| 2017/0103937 | A1 * | 4/2017 | Hsieh ...................... | H01L 24/83 |

* cited by examiner

*Primary Examiner* — Andres Munoz
(74) *Attorney, Agent, or Firm* — JCIPRNET

(57) ABSTRACT

Cryogenic integrated circuits are provided. A cryogenic integrated circuit includes a thermally conductive base, a data processor, a storage device, a buffer device, a thermally conductive shield and a cooling pipe. The data processor is located on the thermally conductive base. The storage device is located on the thermally conductive base and disposed aside and electrically connected to the data processor. The buffer device is disposed on the data processor. The thermally conductive shield covers the data processor, the storage device and the buffer device. The cooling pipe is located in physical contact with the thermally conductive base and disposed at least corresponding to the data processor.

20 Claims, 6 Drawing Sheets

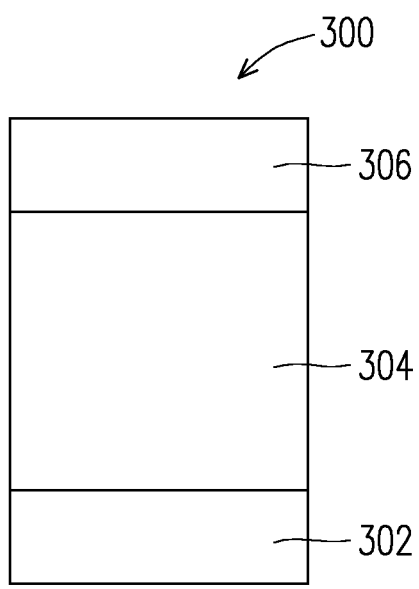
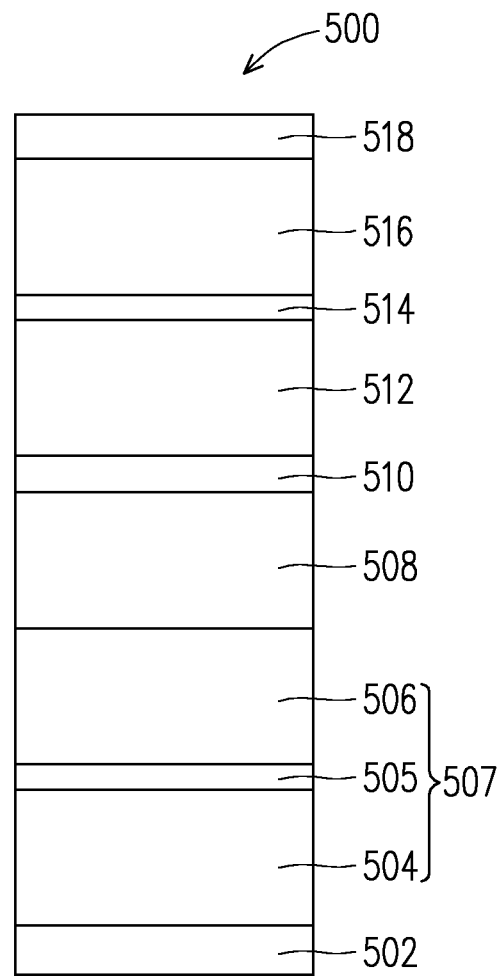
FIG. 4
FIG. 5

US 11,183,449 B1

CRYOGENIC INTEGRATED CIRCUITS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, a server with high computing performance is developed. Although the existing server of a data center has been generally adequate for its intended purposes, such server has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 4 is a schematic cross-sectional view of a memory stack in accordance with some embodiments.

FIG. 5 is a schematic cross-sectional view of a memory stack in accordance with some embodiments.

DETAILED DESCRIPTION

Figure 1:
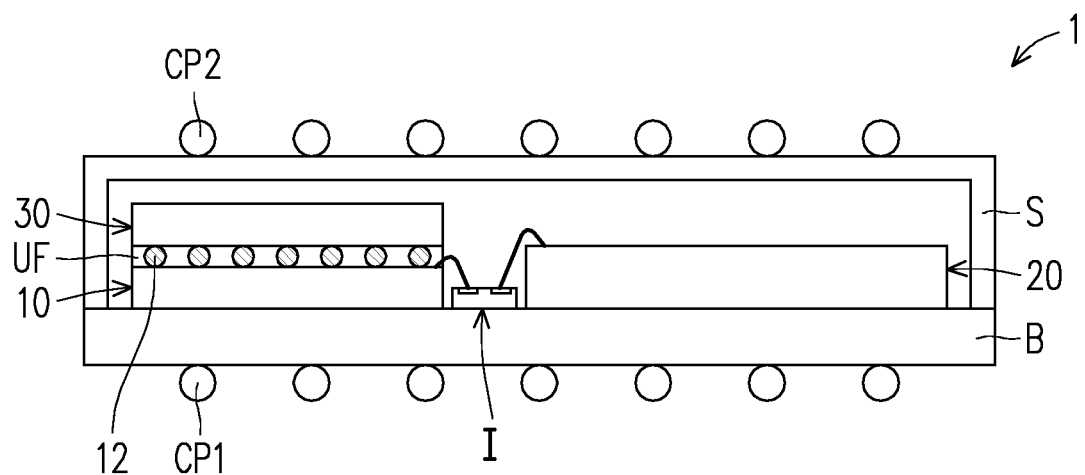
FIG. 1 is a simplified cross-sectional view of a cryogenic integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Operating computers and computer chips at cryogenic temperatures have been demonstrated to improve the computing speed and to reduce the certain loss. However, the conventional server is cooled down by air conditioners. Due to the capacity of the air cooling system, the operation temperature is around 400K and results in the degradation of the device performance. Accordingly, the present disclosure provides a cryogenic integrated circuit (e.g., a server or a computer) that includes a cooling pipe at least in physical contact with a data processor thereof. By such disposition, the cryogenic integrated circuit of the disclosure can be operated at a temperature of about 50K to 273K (e.g., 50K to 250K or about 77K to 220K), so the computing speed can be significantly improved, and the power consumption can be greatly reduced.

Figure 2:
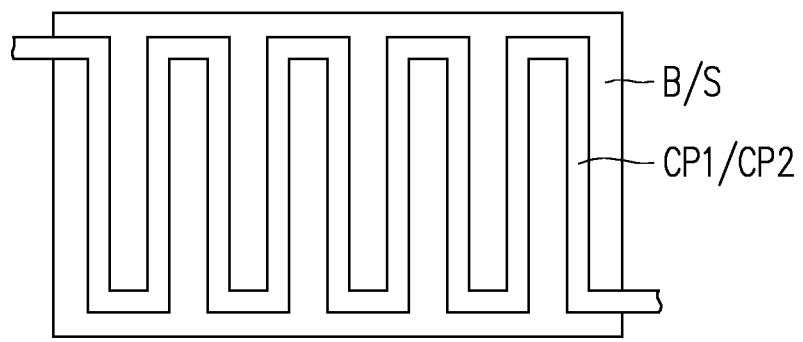
FIG. 2 is a schematic top view of a cooling pipe in accordance with some embodiments.
Figure 3A:
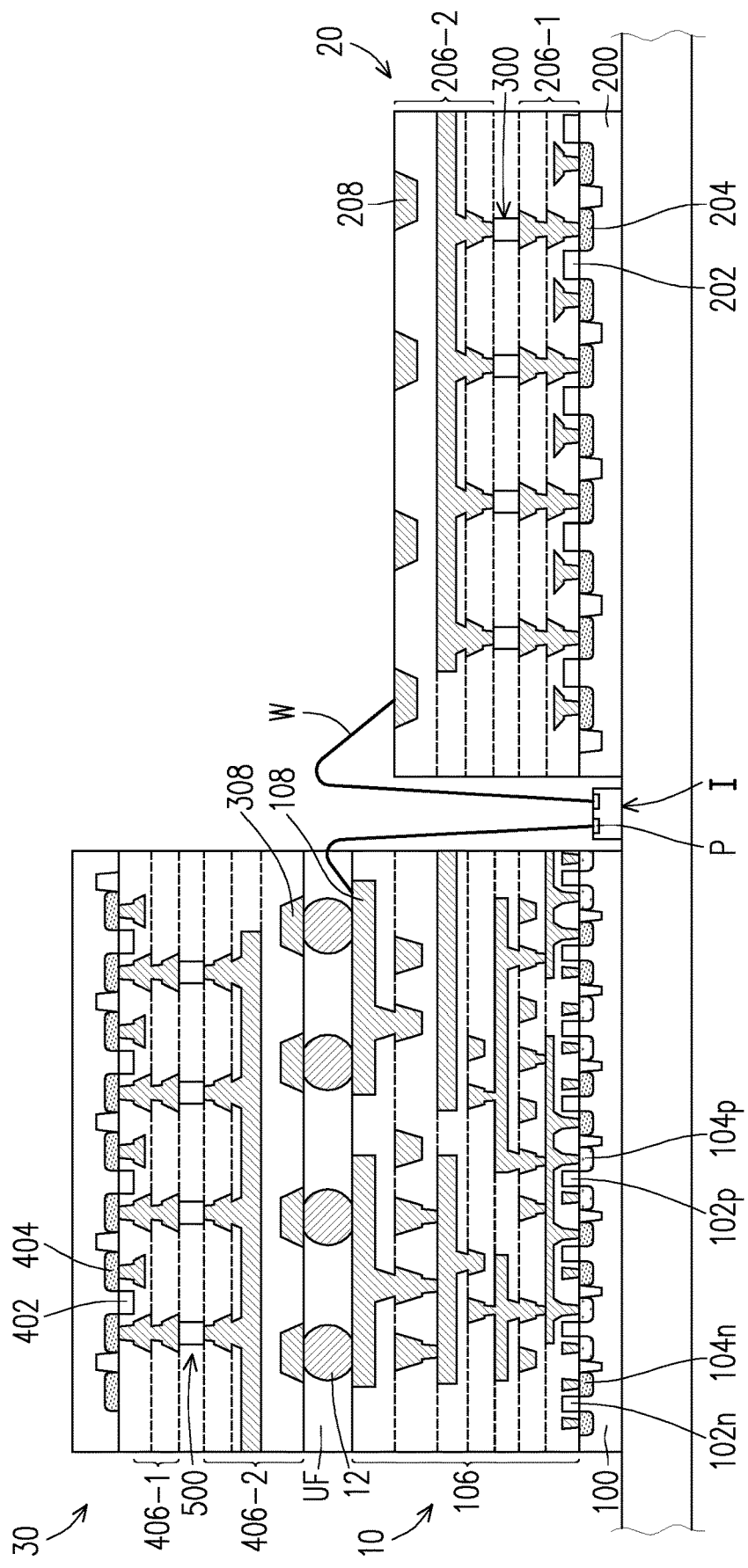
FIG. 3A is a schematic cross-sectional view of part of a cryogenic integrated circuit in accordance with some embodiments.
Figure 3B:
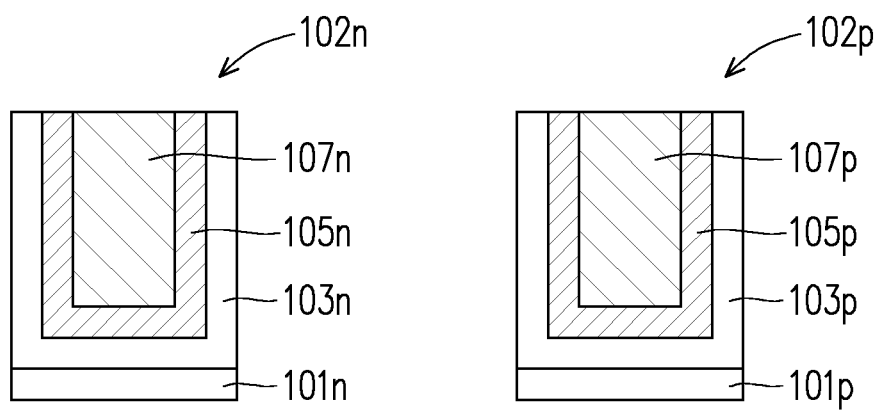
FIG. 3B is a schematic cross-sectional view of part of a CMOS device of a cryogenic integrated circuit in accordance with some embodiments.

FIG. 1 is a simplified cross-sectional view of a cryogenic integrated circuit in accordance with some embodiments. FIG. 2 is a schematic top view of a cooling pipe in accordance with some embodiments. FIG. 3A is a schematic cross-sectional view of part of a cryogenic integrated circuit in accordance with some embodiments. FIG. 3B is a schematic cross-sectional view of part of a CMOS device of a cryogenic integrated circuit in accordance with some embodiments.

In some embodiments, as shown in FIG. 1, a cryogenic integrated circuit 1 includes a thermally conductive base B and a thermally conductive shield S over the thermally conductive base B. In some embodiments, the thermally conductive base B includes metal, such as Cu, Al, the like, or an alloy thereof. The thermally conductive base B is referred to as a metal base or a metal substrate in some examples. In some embodiments, the thermally conductive base B has a thickness of about 0.5 cm to 1 cm. In some embodiments, the thermally conductive shield S includes metal, such as Cu, Al the like, or an alloy thereof. The thermally conductive shield S is referred to as a metal shield or a metal cover in some examples. The thermally conductive base B and the thermally conductive shield S are made by the same or different materials. A suitable thermally conductive material other than metal may be used in the thermally conductive base B and the thermally conductive shield S. Besides, the thickness of the thermally conductive shield S is the same as or different from (e.g., less than) that of the thermally conductive base B. In some embodiments, the thermally conductive shield S has a thickness of about 0.1 mm to 2 mm. In other embodiments, the thermally conductive shield S has a thickness of about 0.5 cm to 1 cm.

The space enclosed by the thermally conductive base B and the thermally conductive shield S is in a vacuum state or filled with an inert gas. In some embodiments, the storage space has a height of about 2 cm to 5 cm. The space is maintained at a low temperature for the devices placed therein. In the embodiments, the cryogenic integrated circuit 1 further includes a cooling pipe CP for cooling the devices placed in the space. In some embodiments, the cooling pipe CP includes a first cooling pipe CP1 and a second cooling pipe CP2. In some embodiments, the first cooling pipe CP1 is configured to be in physical contact with the outer surface of the thermally conductive base B, and the second cooling pipe CP2 is configured to be in physical contact with the outer surface of the thermally conductive shield S. The first and second cooling pipes CP1 and CP2 are filled with liquid coolant, such as liquid nitrogen (L-$N_2$), liquid helium (L-He)

or other refrigerants. Other refrigerants may include hydrofluorocarbons and/or chlorofluorocarbons. In some embodiments, each of the first and second cooling pipes CP1 and CP2 has a snake shape from a top view, as shown in FIG. 2. However, the disclosure is not limited thereto. Each of the first and second cooling pipes CP1 and CP2 may have another shape (e.g., comb shape or spiral shape) as long as the cooling pipes are capable of cooling the devices.

In some embodiments, the thermally conductive base B is controlled, by the cooling pipe CP, at a temperature different from (e.g., lower than) that of the thermally conductive shield S. For example, the temperature of the thermally conductive base B is controlled at about 50K to 273K (e.g., about 50K to 250K or about 77K to 220K), and the temperature of the thermally conductive shield S is controlled at about 150K to 273K. In other embodiments, the thermally conductive base B is controlled at a temperature substantially the same as that of the thermally conductive shield S.

In some embodiments, as shown in FIG. 1 and FIG. 3A, the cryogenic integrated circuit 1 further includes a data processor 10, a storage device 20 and a buffer device 30 disposed in the space enclosed by the thermally conductive base B and the thermally conductive shield S.

The data processor 10 is located on the thermally conductive base B. In some embodiments, the data processor 10 has a height of about 10 μm to 20 μm. In some embodiments, the data processor 10 can be selected from at least one of a micro-processor unit (MPU) and a digital signal processor (DSP). In some embodiments, the data processor 10 includes a complementary metal oxide semiconductor (CMOS) device. Other data processor or device may be applicable. In some embodiments, the temperature of the CMOS device is controlled at about 50K to 273K (e.g., about 50K to 250K or about 77K to 220K). The CMOS device as a data processor is referred to as a cryogenic CMOS device in some examples.

In some embodiments, as shown in FIG. 3A and FIG. 3B, the CMOS device includes a semiconductor substrate 100, an N-type device 102n and a P-type device 102p. The semiconductor substrate 100 may include a silicon substrate, a silicon-on-insulator (SOI) substrate, a silicon germanium substrate, or a suitable semiconductor substrate. In some embodiments, the semiconductor substrate 100 is provided with fins. In other embodiments, the semiconductor substrate 100 is provided with nanowires. In some other embodiments, the semiconductor substrate 100 is a planar substrate.

In some embodiments, the N-type device 102n (e.g., N-type FinFET device) includes a first high-k layer 103n disposed over the semiconductor substrate 100, and an N-type work function metal layer 105n disposed over the first high-k layer 103n. Each of the first high-k layer 103n and the N-type work function metal layer 105n may have a U-shape in cross-section. In some embodiments, the P-type device 102p (e.g., P-type FinFET device) includes a second high-k layer 103p disposed over the semiconductor substrate 100, and a P-type work function metal layer 105p disposed over the second high-k layer 103p. Each of the second high-k layer 103p and the P-type work function metal layer 105p may have a U-shape in cross-section. Each of the first high-k layer 103n and the second high-k layer 103p may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, for the cryogenic operation, the work function value of the N-type work function metal layer 103n ranges from about 4.25 to 4.30 eV, and the work function value of the P-type work function metal layer 103p ranges from about 5.00 to 5.05 eV. The work function values outside of the above ranges may not be applicable for the cryogenic operation of the device. In some embodiments, the N-type work function metal layer 103n includes Al, Mn, Zr, Bi, Pb, Ta, Ag, V, Zn, Ti, Nb, the like, or a combination thereof, and the P-type work function metal layer 103p includes Te, Re, Rh, Be, Co, Au, Pd, Ni, the like, or a combination thereof.

In some embodiments, the N-type device 102n further includes a first interfacial layer 101n between the semiconductor substrate 100 and the first high-k layer 103n, and a first metal filling layer 107n over the N-type work function metal layer 105n. In some embodiments, the P-type device 102p further includes a second interfacial layer 101p between the semiconductor substrate 100 and the second high-k layer 103p, and a second metal filling layer over 107p over the P-type work function metal layer 105p. Each of the first interfacial layer 103n and the second interfacial layer 103p may include silicon oxide. Each of the first metal filling layer 107n and the second metal filling layer 107p may include W.

In some embodiments, the N-type device 102n further includes first strained layers 104p in the semiconductor substrate 100 aside the metal gate. In some embodiments, the P-type device 102p further includes second strained layers 104p in the semiconductor substrate 100 aside the metal gate. The first strained layers 104n may include silicon carbon (SiC), silicon phosphate (SiP), SiCP or a SiC/SiP multi-layer structure, and the second strained layers 110b may include silicon germanium (SiGe).

In some embodiments, as shown in FIG. 3A, the CMOS device includes an interconnection layer 106. The interconnect structure 106 is disposed over the semiconductor substrate 100 and electrically connected to the N-type device 102n and the P-type device 102p. In some embodiments, the interconnect structure 106 includes metal features embedded by dielectric layers. The metal features include contacts, vias and/or lines. A portion of the metal features, such as top metal features 108, are exposed by the topmost dielectric layer. The metal features may include W, Cu, a copper alloy, Al, an aluminum alloy or a combination thereof. The dielectric layers may include silicon oxide, silicon oxynitride, silicon nitride, a low dielectric constant (low-k) material having a dielectric constant less than 3.5 or a combination thereof. In some embodiments, a barrier layer may be disposed between a metal feature and the adjacent dielectric layer to prevent the material of the metal features from migrating to the underlying devices. The barrier layer may include Ta, TaN, Ti, TiN, CoW or a combination thereof.

In some embodiments, as shown in FIG. 1 and FIG. 3A, the storage device 20 is located on the thermally conductive base B and disposed aside and electrically connected to the data processor 10. In some embodiments, the storage device 20 has a height of about 10 μm to 50 μm. In some embodiments, the storage device 20 includes a RRAM device. Other storage device such as PCRAM device may be applicable. In some embodiments, the temperature of the RRAM device is controlled at about 50K to 273K (e.g., about 50K to 250K or about 77K to 220K). The RRAM device as a storage device is referred to as a cryogenic RRAM device in some examples.

In some embodiments, as shown in FIG. 3A, the RRAM device includes a semiconductor substrate 200 and a device 202. The semiconductor substrate 200 may include a silicon substrate, a silicon-on-insulator (SOI) substrate, a silicon germanium substrate, or a suitable semiconductor substrate.

In some embodiments, the semiconductor substrate 200 is provided with fins. In other embodiments, the semiconductor substrate 200 is provided with nanowires. In some other embodiments, the semiconductor substrate 200 is a planar substrate.

In some embodiments, the device 202 may include an N-type device (e.g., N-type FinFET device) in a cell region. The device 202 may further include a P-type device (e.g., P-type FinFET device) in a periphery region as needed. In some embodiments, the device 202 may have a structure similar to that of the N-type device 102n. For example, the device 202 includes a high-k layer disposed over the semiconductor substrate 200, and an N-type work function metal layer disposed over the high-k layer. Each of the high-k layer and the N-type work function metal layer may have a U-shape in cross-section. The high-k layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, the work function value of the N-type work function metal layer ranges from about 4.25 to 4.30 eV. In other embodiments, the work function value of the N-type work function metal layer ranges from about 4.10 to 4.30 eV. The work function values outside of the above ranges may not be applicable for the cryogenic operation of the device. In some embodiments, the N-type work function metal layer includes Al, Mn, Zr, Bi, Pb, Ta, Ag, V, Zn, Ti, Nb, the like, or a combination thereof.

In some embodiments, the device 202 further includes an interfacial layer between the semiconductor substrate 200 and the high-k layer, and a metal filling layer over the N-type work function metal layer. The interfacial layer may include silicon oxide. The metal filling layer may include W. In some embodiments, the device 202 further includes strained layers 204 in the semiconductor substrate 200 aside the metal gate. The strained layers 204 may include silicon carbon (SiC), silicon phosphate (SiP), SiCP or a SiC/SiP multi-layer structure.

In some embodiments, as shown in FIG. 3A, the RRAM device includes an interconnection layer 206. The interconnect structure 206 is disposed over the semiconductor substrate 200 and electrically connected to the device 202. In some embodiments, the interconnect structure 206 includes metal features embedded by dielectric layers. The metal features include contacts, vias and/or lines. A portion of the metal features, such as top metal features 208, are exposed by the topmost dielectric layer. The metal features may include W, Cu, a copper alloy, Al, an aluminum alloy or a combination thereof. The dielectric layers may include silicon oxide, silicon oxynitride, silicon nitride, a low dielectric constant (low-k) material having a dielectric constant less than 3.5 or a combination thereof. In some embodiments, a barrier layer may be disposed between a metal feature and the adjacent dielectric layer to prevent the material of the metal features from migrating to the underlying devices. The barrier layer may include Ta, TaN, Ti, TiN, CoW or a combination thereof.

In some embodiments, as shown in FIG. 3A, the interconnection layer 206 is divided to a lower interconnection layer 206-1 and an upper interconnection layer 206-2, and a memory stack 300 is interposed between and electrically connected to the lower interconnection layer 206-1 and the upper interconnection layer 206-2. In some embodiments, the memory stack 300 is a RRAM stack, as shown in FIG. 4.

Referring to FIG. 4, the memory stack 300 includes a bottom electrode 302, a top electrode 306 disposed over the bottom electrode 302, and a resistive-switching layer 304 disposed between the bottom electrode 302 and the top electrode 306. In some embodiments, the bottom electrode 302 includes Ti, TaN, TiN, TiAlN, TiW, Pt, W, Ru, the like or a combination thereof. In some embodiments, the bottom electrode 302 has a thickness of about 10 nm to 25 nm. In some embodiments, the top electrode 306 includes Ti, TaN, TiN, TiAlN, TiW, Pt, W, Ru, the like or a combination thereof. In some embodiments, the top electrode 306 has a thickness of about 10 nm to 25 nm. In some embodiments, the material of the bottom electrode 302 may be the same as that of the top electrode 306. In other embodiments, the bottom electrode 302 may have a material different from that of the top electrode 306.

In some embodiments, the resistive-switching layer 304 includes a metal oxide, such as a transition metal oxide. The transition metal oxide may include $ZrO_2$, NiO, $TiO_2$, $HfO_2$, ZrO, ZnO, $WO_3$, CoO, $Nb_2O_5$, $Fe_2O_3$, CuO, $CrO_2$, $Ta_2O_5$, the like, or a combination thereof. The resistive-switching layer 304 may be a single-layer or multi-layer structure. In some embodiments, the resistive-switching layer 304 includes $HfO_2$, $Ta_2O_5$ or a combination thereof. In some embodiments, the resistive-switching layer 304 has a thickness of about 3 nm to 15 nm.

In some embodiments, as shown in FIG. 1 and FIG. 3A, the data processor 10 and the storage device 20 are electrically connected to each other through an interposer I therebetween.

The interposer I may include a redistribution layer structure disposed on a semiconductor substrate. The redistribution layer structure includes metal features embedded by dielectric layers. A portion of the metal features, such as top metal pads P, are exposed by the topmost dielectric layer. The redistribution layer structure provides electrical routing to/from one or more devices on the thermally conductive base B. In some embodiments, through substrate vias may extend through the semiconductor substrate and are electrically connected to the conductive features of the redistribution layer structure. In some embodiments, bumps are disposed on the redistribution layer structure to provide electrical connectors for bonding to various components. In some embodiments, in order to achieve a small package profile, the semiconductor substrate of the interposer structure may be thinned or removed during manufacturing, and thus, a silicon-substrate-free (Si-less) or silicon-free interposer structure is provided. In other embodiments, the semiconductor substrate of the interposer structure may remain during manufacturing.

In some embodiments, the top metal features 108 of the data processor 10 and the top metal features 208 of the storage device 20 are electrically connected to the top metal pads P of the interposer I, respectively, through bonding wires W or bonding pins.

In some embodiments, as shown in FIG. 1 and FIG. 3A, the buffer device 30 is disposed on the data processor 10. In some embodiments, the buffer device 30 has a height of about 10 μm to 20 μm. In some embodiments, the buffer device 30 includes a MRAM device, such as a spin torque transfer magnetic random access memory (STT-MRAM) or a spin orbit torque magnetic random access memory (SOT-MRAM). Other storage device may be applicable. In some embodiments, the temperature of the MRAM device is controlled at about 50K to 273K (e.g., about 50K to 250K or about 77K to 220K). In other embodiments, the temperature of the MRAM device is controlled at about 150K to 273K. The MRAM device as a buffer device is referred to as a cryogenic MRAM device in some examples.

In some embodiments, as shown in FIG. 3A, the MRAM device includes a semiconductor substrate 300 and a device 302. The semiconductor substrate 300 may include a silicon substrate, a silicon-on-insulator (SOI) substrate, a silicon germanium substrate, or a suitable semiconductor substrate. In some embodiments, the semiconductor substrate 300 is provided with fins. In other embodiments, the semiconductor substrate 300 is provided with nanowires. In some other embodiments, the semiconductor substrate 300 is a planar substrate.

In some embodiments, the device 302 may include an N-type device (e.g., N-type FinFET device) in a cell region. The device 302 may further include a P-type device (e.g., P-type FinFET device) in a periphery region as needed. In some embodiments, the device 302 may have a structure similar to that of the N-type device 102n. For example, the device 302 includes a high-k layer disposed over the semiconductor substrate 300, and an N-type work function metal layer disposed over the high-k layer. Each of the high-k layer and the N-type work function metal layer may have a U-shape in cross-section. The high-k layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, the work function value of the N-type work function metal layer ranges from about 4.25 to 4.30 eV. In other embodiments, the work function value of the N-type work function metal layer ranges from about 4.10 to 4.30 eV. The work function values outside of the above ranges may not be applicable for the cryogenic operation of the device. In some embodiments, the N-type work function metal layer includes Al, Mn, Zr, Bi, Pb, Ta, Ag, V, Zn, Ti, Nb, the like, or a combination thereof.

In some embodiments, the device 302 further includes an interfacial layer between the semiconductor substrate 300 and the high-k layer, and a metal filling layer over the N-type work function metal layer. The interfacial layer may include silicon oxide. The metal filling layer may include W. In some embodiments, the device 302 further includes strained layers 304 in the semiconductor substrate 300 aside the metal gate. The strained layers 304 may include silicon carbon (SiC), silicon phosphate (SiP), SiCP or a SiC/SiP multi-layer structure.

In some embodiments, as shown in FIG. 3A, the MRAM device includes an interconnection layer 306. The interconnect structure 306 is disposed over the semiconductor substrate 300 and electrically connected to the device 302. In some embodiments, the interconnect structure 306 includes metal features embedded by dielectric layers. The metal features include contacts, vias and/or lines. A portion of the metal features, such as top metal features 308, are exposed by the topmost dielectric layer. The metal features may include W, Cu, a copper alloy, Al, an aluminum alloy or a combination thereof. The dielectric layers may include silicon oxide, silicon oxynitride, silicon nitride, a low dielectric constant (low-k) material having a dielectric constant less than 3.5 or a combination thereof. In some embodiments, a barrier layer may be disposed between a metal feature and the adjacent dielectric layer to prevent the material of the metal features from migrating to the underlying devices. The barrier layer may include Ta, TaN, Ti, TiN, CoW or a combination thereof.

In some embodiments, as shown in FIG. 3A, the interconnection layer 306 is divided to a lower interconnection layer 306-1 and an upper interconnection layer 306-2, and a memory stack 500 is interposed between and electrically connected to the lower interconnection layer 306-1 and the upper interconnection layer 306-2. In some embodiments, the memory stack 500 is a STT-MRAM stack, as shown in FIG. 5.

Referring to FIG. 5, the memory stack 500 includes a bottom electrode 502, a free layer 508, a tunnel barrier layer 510, a reference layer 512 and a top electrode 518.

In some embodiments, the bottom electrode 502 includes Ta, Ru, Cu, the like or a combination thereof. In some embodiments, the bottom electrode 502 has a thickness of about 10 nm to 15 nm.

The free layer 508 is disposed on the bottom electrode 502. The magnetization orientation of the free layer 508 may be switchable in the vertical axis, for example. The switchable magnetization orientation or magnetic anisotropy of the free layer 508 represents two states thereof with respect to the magnetization orientation of the reference layer 512, a parallel state or an antiparallel state. In the parallel state, the magnetic anisotropy of the free layer 508 is in the same direction as that of the reference layer 512, e.g., in the up direction. In the antiparallel state, the magnetic anisotropy of the free layer 508 is in a different direction from that of the reference layer 512, e.g., in the down direction. In some embodiments, the free layer 508 includes one or more of Fe, Co, Ni, FeCo, CoNi, CoFeB, FeB, FePt, FePd and a suitable ferromagnetic material. In some embodiments, the second free layer 508 includes CoFeB and has a thickness of about 10 nm to 25 nm.

The reference layer 512 is disposed on the free layer 508. The reference layer 512 has a fixed orientation or polarity, e.g., in the up direction, perpendicular to a substrate plane or a plane which the memory stack 500 sits on. In some embodiments, the reference layer 512 includes one or more of Fe, Co, Ni, FeCo, CoNi, CoFeB, FeB, FePt, FePd and a suitable ferromagnetic material. In some embodiments, the reference layer 512 includes FeCo, CoFeB, FeB, the like, or a combination thereof. In some embodiments, the reference layer 512 includes CoFeB and has a thickness of about 10 nm to 25 nm.

The tunneling barrier layer 510 is disposed between the free layer 508 and the reference layer 512. The tunneling barrier layer 510 barriers the tunneling of charge carriers between the reference layer 512 and the free layer 508. In some embodiments, the tunneling barrier layer 510 includes an amorphous barrier, such as aluminum oxide ($AlO_x$) or titanium oxide ($TiO_x$), or a crystalline barrier, such as magnesium oxide (MgO) or a spinel (e.g., $MgAl_2O_4$). In some embodiments, the tunneling barrier layer 510 includes MgO and has a thickness of about 1 nm to 5 nm.

The top electrode 518 is disposed over the reference layer 512. In some embodiments, the top electrode 518 includes Ta, Ru, Cu, the like or a combination thereof. In some embodiments, the bottom electrode 518 has a thickness of about 5 nm to 10 nm. In some embodiments, the material of the top electrode 518 may be the same as that of the bottom electrode 502. In other embodiments, the top electrode 518 may have a material different from that of the bottom electrode 502.

In some embodiments, the memory stack 500 further includes a pinned layer 516 over the reference layer 512. The pinned layer 516 is configured to fix the orientation or magnetic anisotropy of the reference layer 512. In some embodiments, the pinned layer 516 is optional and is not a part of the memory stack 500. In some embodiments, the pinned layer 516 has a fixed orientation or polarity, e.g., in the down direction, perpendicular to the substrate plane or the plane which the memory stack 500 sits on. In some embodiments, the pinned layer 510 includes one or more of Fe, Co, Ni, FeCo, CoNi, CoFeB, FeB, FePt, FePd and a suitable ferromagnetic material. In some embodiments, the pinned layer 516 includes CoFeB and has a thickness of about 10 nm to 25 nm.

In some embodiments, the memory stack 500 further includes a barrier layer 514 between the reference layer 512 and the pinned layer 516. In some embodiments, the barrier layer 514 includes one or more of W, Mo, Ru, Ir and a suitable material. In some embodiments, the barrier layer 514 includes Ru and has a thickness of about 1 nm.

Referring to FIG. 5, in some embodiments, the memory stack 500 further includes a spin polarization layer 507 between the bottom electrode 502 and the free layer 508. In some embodiments, the spin-polarized electron current of the spin polarization layer 507 eliminates the need for an external magnetic field to switch the free layer 508. In some embodiments, the spin polarization layer 507 is disposed over the bottom electrode 502 and includes two layers configured to have magnetic anisotropies perpendicular to each other. For example, the spin polarization layer 507 includes a first spin polarization layer 504, a second spin polarization layer 506 and a buffer layer 505 disposed between the first spin polarization layer 504 and the second spin polarization layer 506. In some embodiments, the first spin polarization layer 504 has a fixed orientation or polarity, e.g., in the up direction, perpendicular to the substrate plane or the plane which the memory stack 500 sits on. In some embodiments, the first spin polarization layer 504 includes Pt, CoFeB or a combination thereof and has a thickness of about 15 nm to 25 nm. The second spin polarization layer 506 is switchable in the horizontal axis, for example. In some embodiments, the second spin polarization layer 506 includes IrMn, PtMn or a combination thereof and has a thickness of about 15 nm to 25 nm. In some embodiments, the buffer layer 505 includes one or more of W, Mo, Ru, Ir and a suitable material. In some embodiments, the buffer layer 505 includes Ru and has a thickness of about 1 nm.

In some embodiments, the buffer device 30 is electrically connected to the data processor 10 through the bumps 12 therebetween. In some embodiments, the bumps 12 include copper, solder, nickel or a combination thereof. In some embodiments, the bumps 12 may be solder balls, controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like.

The above embodiments in which the buffer device 30 is flip-chipped and bonded to the data processor 10 in a back-to-back manner are provided for illustration purposes, and are not construed as limiting the present disclosure. In other embodiments, another face-to-back configuration or back-to-back configuration may be applied.

In some embodiments, an underfill layer UF is further included to surround the bumps 12 and fills the space between the buffer device 30 and the data processor 10. In some embodiments, the underfill layer UF includes a molding compound such as epoxy.

In the disclosure, the data processor 10, the storage device 20 and the buffer device 30 are enclosed by the space provided by the thermally conductive base B and the thermally conductive shield S, and a cooling pipe CP is in physical contact with the thermally conductive base B and/or the thermally conductive shield S, so as to cool down the data processor 10, the storage device 20 and the buffer device 30 in the space. By such disposition, the cryogenic integrated circuit of the disclosure can be operated at a temperature of about 50K to 273K, so the computing speed can be significantly improved, and the power consumption can be greatly reduced. Besides, the operation voltages of the devices are reduced in a cryogenic environment. In some embodiments, the operation voltage of each of the data processor 10 and the buffer device 30 ranges from about 0.6 V to 1.2 V, and the operation voltage of the storage device 20 ranges from about 1.0 V to 2.0 V.

When the cryogenic integrated circuit is operated, at least one hot spot is generated inside the devices, specifically inside the data processor. In the disclosure, the cooling pipe is distributed around the cryogenic integrated circuit, and disposed at least corresponding to the data processor, so as to eliminate the hot spot and therefore improve the circuit performance in the cryogenic environment.

In some embodiments, the cooling pipe CP is evenly distributed on the outer surfaces of the thermally conductive base B and the thermally conductive shield S, as shown in FIG. 1. Specifically, the cooling pipe CP includes a first cooling pipe CP1 and a second cooling pipe CP2. In some embodiments, the first cooling pipe CP1 is configured to be in physical contact with the outer surface of the thermally conductive base B, and the second cooling pipe CP2 is configured to be in physical contact with the outer surface of the thermally conductive shield S. Besides, the distribution density of the first cooling pipe CP1 is similar to that of the second cooling pipe CP2. However, the disclosure is not limited thereto.

The cooling pipe distribution of the cryogenic integrated circuit 1 of FIG. 1 may be modified to have other configurations, as shown in FIG. 6 to FIG. 9. The same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Figure 6:
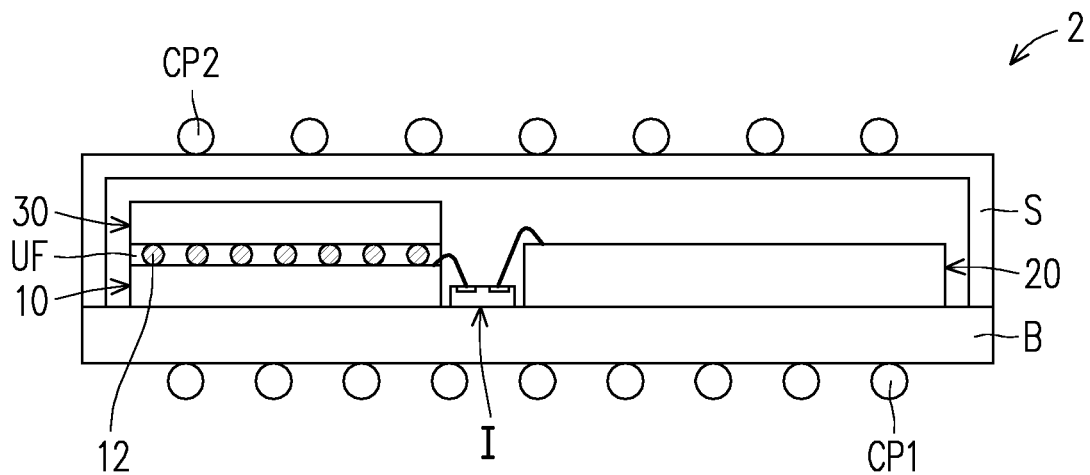
FIG. 6 to FIG. 9 are simplified cross-sectional views of various cryogenic integrated circuits in accordance with other embodiments.

The cryogenic integrated circuit 2 of FIG. 6 is similar to the cryogenic integrated circuit 1 of FIG. 1, and the difference between them lies in that, in the cryogenic integrated circuit 2, the distribution density of the first cooling pipe CP1 is different from that of the second cooling pipe CP2; while in the cryogenic integrated circuit 1, the distribution density of the first cooling pipe CP1 is similar to that of the second cooling pipe CP2. Specifically, in FIG. 6, the first cooling pipe CP1 on the outer surface of the thermally conductive base B is uniform, and the second cooling pipe CP2 on the outer surface of the thermally conductive shield S is uniform. In addition, the distribution density of the first cooling pipe CP1 is greater than that of the second cooling pipe CP2.

Figure 7:
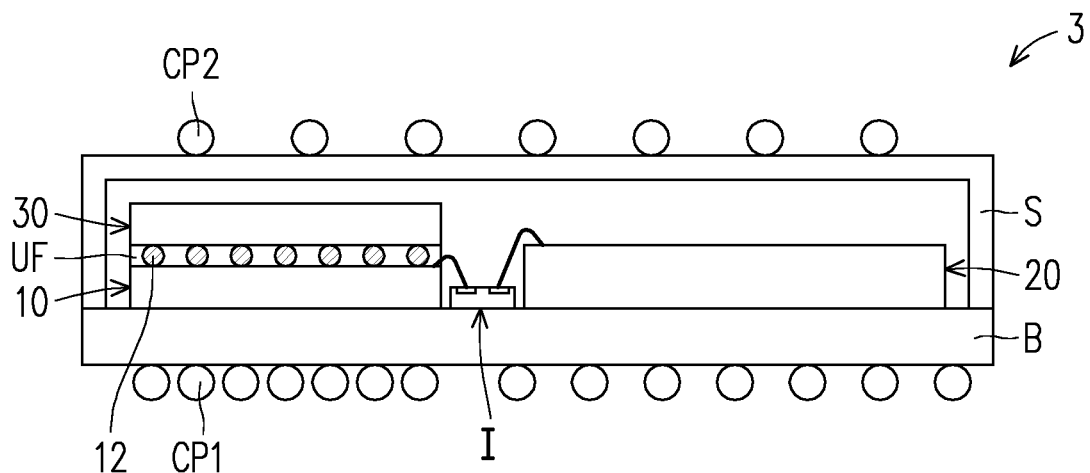

The cryogenic integrated circuit 3 of FIG. 7 is similar to the cryogenic integrated circuit 1 of FIG. 1, and the difference between them lies in that, in the cryogenic integrated circuit 3, the distribution density of the first cooling pipe CP1 is different from that of the second cooling pipe CP2; while in the cryogenic integrated circuit 1, the distribution density of the first cooling pipe CP1 is similar to that of the second cooling pipe CP2. Specifically, in FIG. 7, the first cooling pipe CP1 on the outer surface of the thermally conductive base B is uniform, and the second cooling pipe CP2 on the outer surface of the thermally conductive shield S is non-uniform. In addition, he first cooling pipe CP1 is distributed more around the data processor 10 and distributed less around the storage device 20.

Figure 8:
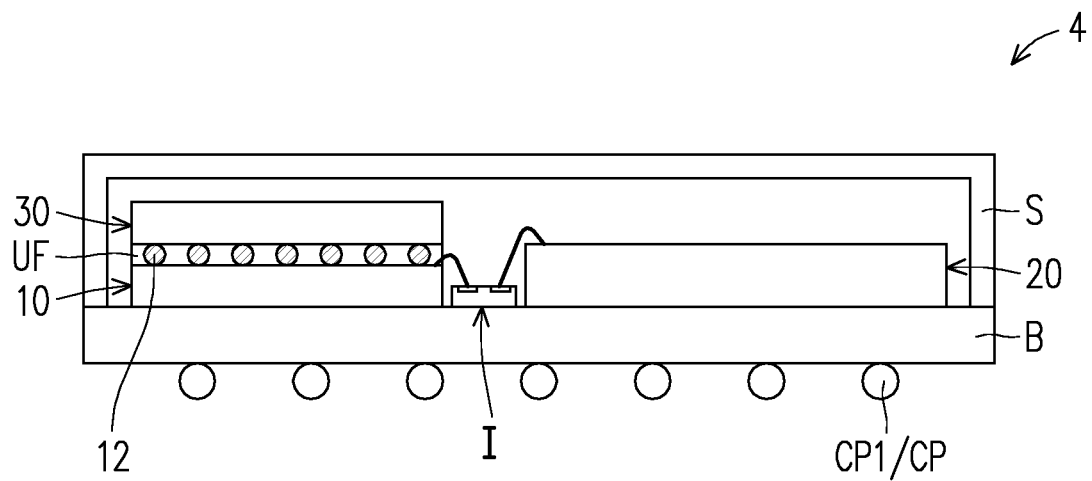

The cryogenic integrated circuit 4 of FIG. 8 is similar to the cryogenic integrated circuit 1 of FIG. 1, and the difference between them lies in that, the second cooling pipe CP2 is provided in the cryogenic integrated circuit 1 while the second cooling pipe is omitted from the cryogenic integrated circuit 4. Specifically, in FIG. 8, due to the cost and/or space limitation, the cooling pipe CP is merely located on the outer surface of the thermally conductive base B.

Figure 9:
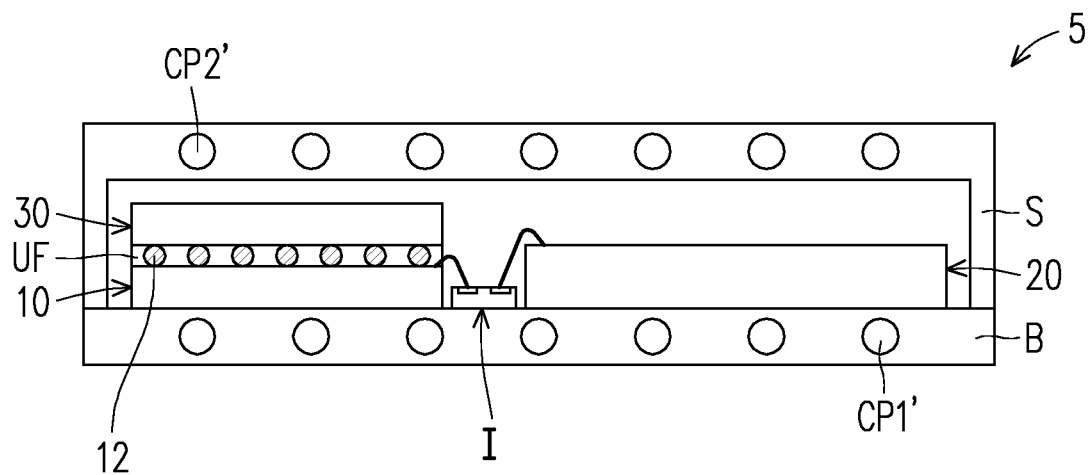

The cryogenic integrated circuit 5 of FIG. 9 is similar to the cryogenic integrated circuit 1 of FIG. 1, and the difference between them lies in that, in the cryogenic integrated circuit 5, the cooling pipe CP is embedded in each of the thermally conductive base B and the thermally conductive shield S, while in the cryogenic integrated circuit 1, the cooling pipe CP is disposed on an outer surface of each of the thermally conductive base B and the thermally conductive shield S. Specifically, in FIG. 9, the first cooling pipe CP1' is embedded in the thermally conductive base B and distributed uniformly, and the second cooling pipe CP2' is embedded in the thermally conductive shield S and distributed uniformly. Besides, the distribution density of the first cooling pipe CP1' is similar to that of the second cooling pipe CP2'. The cooling pipe distribution of FIG. 6 to FIG. 8 may be applied to the cryogenic integrated circuit 5 of FIG. 9, so as to integrate or embed the cooling pipe into the metal base and/or the metal shield, and therefore improve the cooling effect of the device.

The structures of the cryogenic integrated circuits are illustrate below with reference to FIG. 1 to FIG. 9.

In some embodiments, the present disclosure provides a cryogenic integrated circuit 1/2/3/4/5 that includes a thermally conductive base B, a data processor 10, a storage device 20, a buffer device 30, a thermally conductive shield S and a cooling pipe CP. In some embodiments, the cryogenic integrated circuit 1/2/3/4/5 is configured to operate at a temperature of about 50K to 276K, such as about 50K to 250K or about 77K to 220K.

The thermally conductive base B may be a metal substrate. The data processor 10 is located on the thermally conductive base B. The data processor 10 includes a cryogenic CMOS device. In some embodiments, the cryogenic CMOS device includes a semiconductor substrate 100, an N-type device 102n and a P-type device 102p. The N-type device 102n includes a first high-k layer 103n disposed over the semiconductor substrate 100, and an N-type work function metal layer 105n disposed over the first high-k layer 103n. In some embodiments, a work function value of the N-type work function metal layer 105n ranges from about 4.25 to 4.30 eV, and the N-type work function metal layer 105n includes Al, Mn, Zr, Bi, Pb, Ta, Ag, V, Zn, Ti, Nb or a combination thereof. The P-type device 102p includes a second high-k layer 103p disposed over the semiconductor substrate 100, and a P-type work function metal layer 105p disposed over the second high-k layer. In some embodiments, a work function value of the P-type work function metal layer 105p ranges from about 5.00 to 5.05 eV, and the P-type work function metal layer 105p includes Te, Re, Rh, Be, Co, Au, Pd, Ni or a combination thereof. Besides, the cryogenic CMOS device is configured to operate at a temperature of about 50K to 273K.

The storage device 20 includes a RRAM device. The storage device 20 is located on the thermally conductive base B and disposed aside and electrically connected to the data processor 10. In some embodiments, the data processor 10 and the storage device 20 are electrically connected to each other through an interposer I therebetween.

The buffer device 30 includes a MRAM device. The buffer device 30 is disposed on the data processor 10. The buffer device 30 is electrically connected to the data processor 10 through bumps 12 therebetween.

The thermally conductive shield S may be a metal shield. The thermally conductive shield S covers the data processor 10, the storage device 20 and the buffer device 30. In some embodiments, the thermally conductive shield S is separated from the buffer device 30. In other embodiments, the thermally conductive shield S is attached to the buffer device 30 with a heat dissipation layer (e.g., metal sheet or thermally conductive paste) interposed between.

The cooling pipe CP is located in physical contact with the thermally conductive base B and disposed at least corresponding to the data processor 10, as shown in the cryogenic integrated circuit 1/2/3/4/5.

In some embodiments, as shown in the cryogenic integrated circuit 1/2/3/5, the cooling pipe CP is further disposed in physical contact with the thermally conductive shield S, and the thermally conductive base B is controlled, by the cooling pipe CP, at a temperature different from (e.g., lower than) that of the thermally conductive shield S.

In some embodiments, as shown in the cryogenic integrated circuit 1/2/3/4, the cooling pipe is disposed on the outer surface of at least one of the thermally conductive base B and the thermally conductive shield S. In some embodiments, the cooling pipe CP is embedded in at least one the thermally conductive base B and the thermally conductive shield S. In some embodiments, as shown in the cryogenic integrated circuit 5, the cooling pipe CP is embedded in each of the thermally conductive base B and the thermally conductive shield S.

In some embodiments, the cooling pipe has a snake shape (as shown in FIG. 2) and is distributed more around the data processor 10 and less around the storage device 20 (as shown in FIG. 7).

In view of the above, the present disclosure provides a cryogenic integrated circuit (e.g., a server or a computer) that includes a cooling pipe at least in physical contact with a data processor thereof. By such disposition, the area saving for the cooling system and the server in the data center is easily achieved. Besides, the cooling efficiency is significantly improved, and the power consumption is greatly reduced.

In accordance with some embodiments of the present disclosure, a cryogenic integrated circuit includes a thermally conductive base, a data processor, a storage device, a buffer device, a thermally conductive shield and a cooling pipe. The data processor is located on the thermally conductive base. The storage device is located on the thermally conductive base and disposed aside and electrically connected to the data processor. The buffer device is disposed on the data processor. The thermally conductive shield covers the data processor, the storage device and the buffer device. The cooling pipe is located in physical contact with the thermally conductive base and disposed at least corresponding to the data processor.

In accordance with alternative embodiments of the present disclosure, a cryogenic integrated circuit includes a metal substrate, a CMOS device, a RRAM device, and interposer and a cooling pipe. The CMOS device and the RRAM device are laterally located on the metal substrate. The interposer is located on the metal substrate and disposed between and electrically connected to the CMOS device and the RRAM device. The cooling pipe is located in physical contact with the metal substrate and disposed corresponding to the CMOS device and the RRAM device.

In accordance with yet alternative embodiments of the present disclosure, a cryogenic integrated circuit includes a cryogenic CMOS device that includes a semiconductor substrate, an N-type device and a P-type device. The N-type device includes a first high-k layer disposed over the semiconductor substrate; and an N-type work function metal layer disposed over the first high-k layer, wherein a work function value of the N-type work function metal layer ranges from 4.25 to 4.30 eV, and the N-type work function metal layer includes Al, Mn, Zr, Bi, Pb, Ta, Ag, V, Zn, Ti, Nb or a combination thereof. The P-type device includes a second high-k layer disposed over the semiconductor substrate; and a P-type work function metal layer disposed over the second high-k layer, wherein a work function value of the P-type work function metal layer ranges from 5.00 to 5.05 eV, and the P-type work function metal layer includes Te, Re, Rh, Be, Co, Au, Pd, Ni or a combination thereof. Besides, the cryogenic CMOS device is configured to operate at a temperature of about 50K to 273K.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cryogenic integrated circuit, comprising:
a thermally conductive base;
a data processor located on the thermally conductive base;
a storage device located on the thermally conductive base and disposed aside and electrically connected to the data processor;
a buffer device disposed on the data processor;
a thermally conductive shield covering the data processor, the storage device and the buffer device; and
a cooling pipe located in physical contact with the thermally conductive base and disposed at least corresponding to the data processor.

2. The cryogenic integrated circuit of claim 1, wherein cryogenic integrated circuit is configured to operate at a temperature of about 50K to 273K.

3. The cryogenic integrated circuit of claim 1, wherein the data processor comprises a cryogenic CMOS device.

4. The cryogenic integrated circuit of claim 3, wherein the cryogenic CMOS device comprises:
an N-type device having a work function value of 4.25 to 4.30 eV; and
a P-type device having a work function value of 5.00 to 5.05 eV.

5. The cryogenic integrated circuit of claim 1, wherein the storage device comprises a RRAM device.

6. The cryogenic integrated circuit of claim 1, wherein the buffer device comprises a MRAM device.

7. The cryogenic integrated circuit of claim 1, wherein the data processor and the storage device are electrically connected to each other through an interposer therebetween.

8. The cryogenic integrated circuit of claim 1, wherein the cooling pipe is further disposed in physical contact with the thermally conductive shield, and the thermally conductive base is controlled, by the cooling pipe, at a temperature different from that of the thermally conductive shield.

9. The cryogenic integrated circuit of claim 1, wherein the cooling pipe is disposed on an outer surface of at least one of the thermally conductive base and the thermally conductive shield.

10. The cryogenic integrated circuit of claim 1, wherein the cooling pipe has a snake shape and is distributed more around the data processor and less around the storage device.

11. The cryogenic integrated circuit of claim 1, wherein the cooling pipe is embedded in at least one of the thermally conductive base and the thermally conductive shield.

12. A cryogenic integrated circuit, comprising:
a metal substrate;
a CMOS device and a RRAM device laterally located on the metal substrate;
an interposer located on the metal substrate and disposed between and electrically connected to the CMOS device and the RRAM device; and
a cooling pipe located in physical contact with the metal substrate and disposed corresponding to the CMOS device and the RRAM device.

13. The cryogenic integrated circuit of claim 12, wherein cryogenic integrated circuit is configured to operate at a temperature of about 50K to 273K.

14. The cryogenic integrated circuit of claim 12, wherein the CMOS device comprises:
an N-type device having a work function value of 4.25 to 4.30 eV; and
a P-type device having a work function value of 5.00 to 5.05 eV.

15. The cryogenic integrated circuit of claim 12, further comprising a MRAM device disposed on the CMOS device.

16. The cryogenic integrated circuit of claim 15, further comprising a metal shield covering the CMOS device, the RRAM device and the MRAM device.

17. The cryogenic integrated circuit of claim 15, wherein the MRAM device comprises:
a bottom electrode;
a spin polarization layer disposed over the bottom electrode and comprising two layers configured to have magnetic anisotropies perpendicular to each other;
a free layer disposed over the spin polarization layer;
a tunnel barrier layer disposed over the free layer;
a reference layer disposed over the tunnel barrier layer; and
a top electrode disposed over the reference layer.

18. The cryogenic integrated circuit of claim 17, wherein the spin polarization layer comprises:
a first spin polarization layer having a magnetic anisotropy the same as that of the reference layer;
a second spin polarization layer disposed over the first spin polarization layer; and
a buffer layer disposed between the first spin polarization layer and the second spin polarization layer.

19. The cryogenic integrated circuit of claim 12, wherein the RRAM device comprises:
a bottom electrode;
a top electrode disposed over the bottom electrode; and
a resistive-switching layer disposed between the bottom electrode and the top electrode and comprising a metal oxide.

20. A cryogenic integrated circuit, comprising:
a thermally conductive base;
a cryogenic CMOS device located on the thermally conductive base and comprising:
an N-type device comprising:
a first high-k layer disposed over a semiconductor substrate; and an N-type work function metal layer disposed over the first high-k layer, wherein a work function value of the N-type work function metal layer ranges from 4.25 to 4.30 eV, and the N-type work function metal layer comprises Al, Mn, Zr, Bi, Pb, Ta, Ag, V, Zn, Ti, Nb or a combination thereof; and a P-type device comprising:
    a second high-k layer disposed over the semiconductor substrate; and
    a P-type work function metal layer disposed over the second high-k layer, wherein a work function value of the P-type work function metal layer ranges from 5.00 to 5.05 eV, and the P-type work function metal layer comprises Te, Re, Rh, Be, Co, Au, Pd, Ni or a combination thereof, wherein the cryogenic CMOS device is configured to operate at a temperature of about 50K to 273K;

a thermally conductive shield covering the cryogenic CMOS device; and a cooling pipe located in physical contact with the thermally conductive base and thermally conductive shield.

\* \* \* \* \*